(12) United States Patent
Rabinovich et al.

(10) Patent No.: US 7,789,969 B2
(45) Date of Patent: Sep. 7, 2010

(54) METHODS AND APPARATUS FOR CLEANING CHAMBER COMPONENTS

(75) Inventors: Felix Rabinovich, Cupertino, CA (US); Thomas Echols, San Francisco, CA (US); Janet Maleski, Los Gatos, CA (US); Ning Chen, Fremont, CA (US); Samantha S. H. Tan, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/931,272

(22) Filed: Oct. 31, 2007

(65) Prior Publication Data
US 2008/0099054 A1 May 1, 2008

Related U.S. Application Data

(60) Provisional application No. 60/863,906, filed on Nov. 1, 2006.

(51) Int. Cl.
*B08B 5/04* (2006.01)
*B08B 9/00* (2006.01)
*B08B 3/00* (2006.01)

(52) U.S. Cl. ............ 134/21; 134/22.1; 134/22.12; 134/103.1; 134/104.1; 134/169 R

(58) Field of Classification Search ............ None
See application file for complete search history.

(56) References Cited

U.S. PATENT DOCUMENTS

| | | | |
|---|---|---|---|
| 3,775,202 A | 11/1973 | Meek et al. | |
| 3,969,195 A | 7/1976 | Dotzer et al. | |
| 3,986,653 A | 10/1976 | Gilding | |
| 3,992,454 A | 11/1976 | Kessler | |
| 4,023,936 A | 5/1977 | Morse et al. | |
| 4,078,963 A | 3/1978 | Symersky | |
| 4,101,386 A | 7/1978 | Dotzer et al. | |
| 4,139,348 A | 2/1979 | Swartz | |
| 4,197,631 A | 4/1980 | Meyer et al. | |

(Continued)

FOREIGN PATENT DOCUMENTS

DE    19616231    10/1996

(Continued)

OTHER PUBLICATIONS

Hoffman, H.S., "Molybdenum Cleaning Solution", IBM Technical Disclosure Bulletin, 3(5):36, (1960).

(Continued)

*Primary Examiner*—Michael Cleveland
*Assistant Examiner*—Nicole Blan
(74) *Attorney, Agent, or Firm*—Dugan & Dugan, PC

(57) ABSTRACT

In a first aspect, a method for cleaning a semiconductor fabrication chamber component having an orifice is provided. The method includes (A) placing the component into a bath having a cleaning solution; (B) flowing a fluid into the orifice thereby maintaining at least a first portion of the orifice free from cleaning solution while the cleaning solution cleans the component; and (C) withdrawing the fluid from the orifice such that cleaning solution enters into the first portion of the orifice and cleans the first portion of the orifice. Numerous other aspects are also provided.

17 Claims, 6 Drawing Sheets

U.S. PATENT DOCUMENTS

| | | | |
|---|---|---|---|
| 4,214,952 A | 7/1980 | Sato et al. | |
| 4,220,706 A | 9/1980 | Spak | |
| 4,232,060 A | 11/1980 | Mallory, Jr. | |
| 4,272,612 A | 6/1981 | Oliver | |
| 4,327,134 A | 4/1982 | Baldi | |
| 4,367,119 A | 1/1983 | Logan et al. | |
| 4,447,824 A | 5/1984 | Logan et al. | |
| 4,448,800 A | 5/1984 | Ehara et al. | |
| 4,459,155 A | 7/1984 | Cayless | |
| 4,519,914 A | 5/1985 | Etani | |
| 4,530,120 A | 7/1985 | Etani | |
| 4,579,569 A | 4/1986 | Sheng et al. | |
| 4,638,553 A | 1/1987 | Nilarp | |
| 4,699,082 A | 10/1987 | Hakim | |
| 4,863,561 A | 9/1989 | Freeman et al. | |
| 4,900,398 A | 2/1990 | Chen | |
| 4,957,583 A | 9/1990 | Buck et al. | |
| 4,971,590 A | 11/1990 | Tong | |
| 4,980,017 A | 12/1990 | Kaji et al. | |
| 5,104,501 A | 4/1992 | Okabayashi | |
| 5,152,878 A | 10/1992 | Datta et al. | |
| 5,221,421 A | 6/1993 | Leibovitz et al. | |
| 5,248,386 A | 9/1993 | Dastolfo et al. | |
| 5,258,093 A | 11/1993 | Maniar | |
| 5,365,112 A | 11/1994 | Ohshima | |
| 5,516,399 A | 5/1996 | Balconi-Lamica et al. | |
| 5,593,339 A | 1/1997 | Yam et al. | |
| 5,614,027 A | 3/1997 | Dunn et al. | |
| 5,660,640 A | 8/1997 | Laube | |
| 5,665,473 A | 9/1997 | Okoshi et al. | |
| 5,712,198 A | 1/1998 | Shive et al. | |
| 5,744,214 A | 4/1998 | Berasi et al. | |
| 5,749,467 A | 5/1998 | Gregerson | |
| 5,766,979 A | 6/1998 | Budnaitis | |
| 5,840,402 A | 11/1998 | Roberts et al. | |
| 5,851,303 A | 12/1998 | Hwang et al. | |
| 5,863,801 A | 1/1999 | Southgate et al. | |
| 5,865,901 A | 2/1999 | Yin et al. | |
| 5,882,598 A | 3/1999 | Lindquist et al. | |
| 5,888,308 A | 3/1999 | Sachdev et al. | |
| 5,891,354 A | 4/1999 | Lee et al. | |
| 5,908,819 A | 6/1999 | Reynolds et al. | |
| 5,929,521 A | 7/1999 | Wark et al. | |
| 5,966,593 A | 10/1999 | Budnaitis et al. | |
| 5,975,097 A | 11/1999 | Yonemizu et al. | |
| 6,012,966 A | 1/2000 | Ban et al. | |
| 6,083,320 A | 7/2000 | Lee | |
| 6,147,003 A | 11/2000 | Tabara et al. | |
| 6,187,216 B1 | 2/2001 | Dryer et al. | |
| 6,199,563 B1 | 3/2001 | Uehara et al. | |
| 6,273,950 B1 | 8/2001 | Kitabatake | |
| 6,352,081 B1 | 3/2002 | Lu et al. | |
| 6,368,410 B1 | 4/2002 | Gorczyca et al. | |
| 6,375,752 B1 | 4/2002 | Otsuki et al. | |
| 6,394,023 B1 | 5/2002 | Crocker | |
| 6,419,757 B2 | 7/2002 | Otsuki et al. | |
| 6,475,444 B1 | 11/2002 | Zimmerman et al. | |
| 6,488,037 B1 | 12/2002 | Guldi | |
| 6,506,254 B1 | 1/2003 | Bosch et al. | |
| 6,569,252 B1 | 5/2003 | Sachdev et al. | |
| 6,579,153 B2 | 6/2003 | Uchikura et al. | |
| 6,586,343 B1 | 7/2003 | Ho et al. | |
| 6,607,605 B2 | 8/2003 | Tan | |
| 6,648,982 B1 * | 11/2003 | Zuck et al. | 134/30 |
| 6,767,840 B1 | 7/2004 | Uehara et al. | |
| 6,810,887 B2 | 11/2004 | Tan et al. | |
| 7,045,072 B2 | 5/2006 | Tan et al. | |
| 7,091,132 B2 | 8/2006 | Tan et al. | |
| 7,452,475 B2 | 11/2008 | Tan et al. | |
| 2003/0000458 A1 | 1/2003 | Marumo et al. | |
| 2003/0096562 A1 | 5/2003 | Kurogouchi | |
| 2003/0136428 A1* | 7/2003 | Krogh | 134/28 |
| 2003/0183244 A1 | 10/2003 | Rossman | |
| 2004/0060579 A1 | 4/2004 | Kim et al. | |
| 2005/0045209 A1 | 3/2005 | Tan et al. | |
| 2005/0050708 A1 | 3/2005 | Huang et al. | |
| 2005/0085400 A1 | 4/2005 | Tan et al. | |
| 2005/0169808 A1* | 8/2005 | Pinkel et al. | 422/100 |
| 2005/0173569 A1* | 8/2005 | Noorbakhsh et al. | 239/690 |
| 2006/0180180 A1 | 8/2006 | Tan et al. | |
| 2009/0197004 A1 | 8/2009 | Tan et al. | |

FOREIGN PATENT DOCUMENTS

| | | |
|---|---|---|
| EP | 0 894 542 | 2/1999 |
| JP | 50087974 | 7/1975 |
| JP | 58025479 | 2/1983 |
| JP | 362109997 | 5/1987 |
| JP | 62204534 | 9/1987 |
| JP | 11-152590 | 6/1999 |
| JP | 11-290805 | 10/1999 |
| WO | WO 02/15255 A1 | 2/2002 |
| WO | WO 2008/057351 | 5/2008 |

OTHER PUBLICATIONS

Metrology for Manufacturing: Surface Measurement. [online] Michigan Technological University, undated [retrieved on Aug. 9, 2005]. Retrieved from the internet: <URL: http://www.mfg.mtu.edu/cyberman/quality/metrology/surface.html>.

Spring, S., "Metal Cleaning", Reinhold Publishing Corporaton, New York, pp. 85-89, (1963).

International Preliminary Report and Written Opinion of International Application No. PCT/US07/22978 mailed Aug. 18, 2008.

U.S. Appl. No. 10/696,394, filed Oct. 28, 2003.

Derwent English Abstract of TW460611, Oct. 21, 2001.

US Office Action issued Jan. 25, 2006 in U.S. Appl. No. 10/696,394.

US Office Action issued Oct. 6, 2006 in U.S. Appl. No. 10/696,394.

US Final Office Action issued Apr. 3, 2007 in U.S. Appl. No. 10/696,394.

US Office Action issued Nov. 7, 2007 in U.S. Appl. No. 10/696,394.

US Final Office Action issued Apr. 24, 2008 in U.S. Appl. No. 10/696,394.

Notice of Allowance issued Nov. 26, 2008 in U.S. Appl. No. 10/696,394.

U.S. Appl. No. 10/696,394 filed Oct. 28, 2003.

* cited by examiner

METHODS AND APPARATUS FOR CLEANING CHAMBER COMPONENTS

The present application claims priority to U.S. Provisional Patent Application Ser. No. 60/863,906, filed Nov. 1, 2006, which is hereby incorporated by reference herein in its entirety.

FIELD OF THE INVENTION

The present invention relates to semiconductor device manufacturing, and more particularly to methods and apparatus for cleaning components of a chamber used during semiconductor device manufacturing.

BACKGROUND OF THE INVENTION

A gas distribution system of a deposition chamber may include a face plate, gas distribution plate or another gas distribution element having one or more holes, openings and/or other orifices through which gases are flowed during semiconductor device processing. During deposition processes performed within the chamber, the orifices and other surfaces of a gas distribution element may become coated with material, such as deposition species, deposition by-products, etc., of the deposition process.

To ensure proper operation of the deposition chamber and the gas distribution element, the gas distribution element may be periodically cleaned to remove any deposited material from the various surfaces and/or orifices of the gas distribution element. For example, the gas distribution element may be placed in cleaning solution, such as an acid bath, which etches any deposited material from the orifices and other surfaces of the gas distribution element. However, such a cleaning process may damage the gas distribution element and limit its useful lifetime. Accordingly, a need exits for improved methods for cleaning components of a chamber, such as a gas distribution element.

SUMMARY OF THE INVENTION

In a first aspect of the present invention, a first method of cleaning a semiconductor fabrication chamber component having an orifice is provided. The method includes (A) placing the component into a bath having a cleaning solution; (B) flowing a fluid into the orifice thereby maintaining at least a first portion of the orifice free from cleaning solution while the cleaning solution cleans the component; and (C) withdrawing the fluid from the orifice such that cleaning solution enters into the first portion of the orifice and cleans the first portion of the orifice.

In a second aspect of the present invention, a method of cleaning a semiconductor fabrication chamber component having an orifice is provided. The method comprises (A) placing the component into a bath having a cleaning solution; (B) flowing a fluid into the orifice thereby maintaining at least a first portion of the orifice free from cleaning solution while the cleaning solution cleans a second portion of the orifice; and (C) withdrawing the fluid from the orifice such that cleaning solution enters into the first portion of the orifice and cleans the first portion of the orifice.

In a third aspect of the present invention, an apparatus for use during cleaning of a semiconductor device manufacturing component is provided. The apparatus includes (A) a jig having a surface adapted to couple to and form a fluid tight seal with the component; and (B) at least one inlet adapted to deliver a fluid to the component and apply a vacuum to the component during cleaning of the component with a cleaning solution.

Other features and aspects of the present invention will become more fully apparent from the following detailed description, the appended claims and the accompanying drawings.

DETAILED DESCRIPTION

Figure 1A:
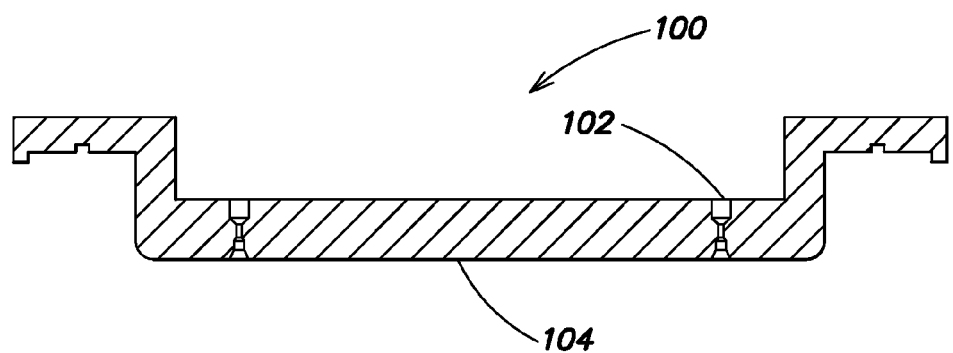
FIG. 1A is a side view of a chamber component, such as a face plate or other gas distribution element, having an orifice.

The present invention provides methods and apparatus for cleaning components of a chamber used during semiconductor device manufacturing. In particular, methods and apparatus are provided that allow chamber components to be cleaned while protecting small geometries of the components that may be damaged by the cleaning process.

In addition, the present invention provides a method of preparing a cleaning solution and using the cleaning solution. The cleaning solution has a cleaning agent, such as an etchant, which removes residue from a component such as a gas distribution element. The cleaning solution may also have a passivator which interacts with the component being cleaned, such as to reduce corrosion of the component.

As stated, a gas distribution system of a deposition chamber may include a face plate, gas distribution plate or other gas distribution element having one or more holes, openings or other orifices through which gases are flowed during semiconductor device processing. During deposition processes performed within the chamber, the orifices and other surfaces of a gas distribution element may become coated with material, such as deposition species, deposition by-products, etc., of the deposition process.

To ensure proper operation of the deposition chamber and the gas distribution element, the gas distribution element may be periodically cleaned to remove any deposited material from the gas distribution element. Typically, the gas distribution element is placed in cleaning solution, such as an acid bath, which etches any deposited material from the orifices and other surfaces of the gas distribution element. However, use of such an acid bath may over etch and/or damage the orifices and/or other small geometry features of the gas distribution element, as the large planar surfaces of the gas distribution element may have relatively thick deposited layers that take longer to remove than the layers formed within the orifices and/or on other small geometry features of the gas distribution element. Such aggressive cleaning of small geometry features of the gas distribution element limits the useful lifetime of the gas distribution element.

Methods and apparatus of the present invention allow cleaning of chamber components, such as gas distribution elements, while protecting small geometries of the components that may be damaged by the cleaning process. For example, in some embodiments of the invention, a gas distribution element may include a major surface (e.g., which faces a substrate during processing) having one or more orifices formed within the major surface and that extend through the gas distribution element. To clean the major surface of the gas distribution element while protecting the orifice(s), the major surface may be placed in a cleaning solution while a gas is fed into the orifice(s). The gas fed into the orifice(s) prevents cleaning solution from entering the orifice(s), or limits entry of cleaning solution into the orifice(s), while the major surface is cleaned.

After the major surface of the gas distribution element has been cleaned, the orifice(s) may be cleaned by reducing or eliminating the gas flow to the orifice(s) so as to allow the cleaning solution to enter the orifice(s). In some embodiments, a vacuum may be employed to draw cleaning solution through the orifice(s).

In this manner, large, relatively etch-insensitive features such as the major surfaces of the gas distribution element may be cleaned during a first phase of cleaning, and small, relatively etch-sensitive features, such as holes or other orifices of the gas distribution element may be cleaned during a more controlled, second phase of cleaning. These and other embodiments of the invention may be employed to clean other chamber components. Exemplary embodiments of the invention are now described below with reference to FIGS. 1A-7.

FIG. 1A is a side view of a chamber component 100, such as a face plate or other gas distribution element, having an orifice 102 (e.g., a hole or otherwise shaped opening that extends through the component 100). Although not shown, the component 100 may also include additional orifices similar to the orifice 102. The component 100 may be used, for example, during a chemical vapor deposition or similar process where a gas passes through the component 100 and reacts and/or deposits onto a substrate (not shown), such as a semiconductor wafer. During use, the component 100 is exposed to deposition species, deposition by-products and the like (e.g., aluminum fluoride and silicon fluoride). As a result, residue from both deposition species and by-products may accumulate within the orifice 102 and on a front face 104 of the component 100. When residue builds up in the orifice 102, the flow rate of a gas through the orifice 102 may be adversely affected. More specifically, the flow rate may decrease, which may adversely affect deposition within the deposition chamber, such that the component 100 may become unreliable and/or unusable during deposition operations.

The component 100 may be cleaned to remove residue from the orifice 102 and the face 104 of the component 100. Typically, the component 100 is placed in a bath having a cleaning solution 106 which includes an etchant (e.g., an acid which breaks down the residue). The etchant etches residue from both the orifice 102 and the face 104. However, the etchant may erode the component 100 such that the dimensions of the orifice 102 change, eventually rendering the component 100 unusable.

Figure 1B:
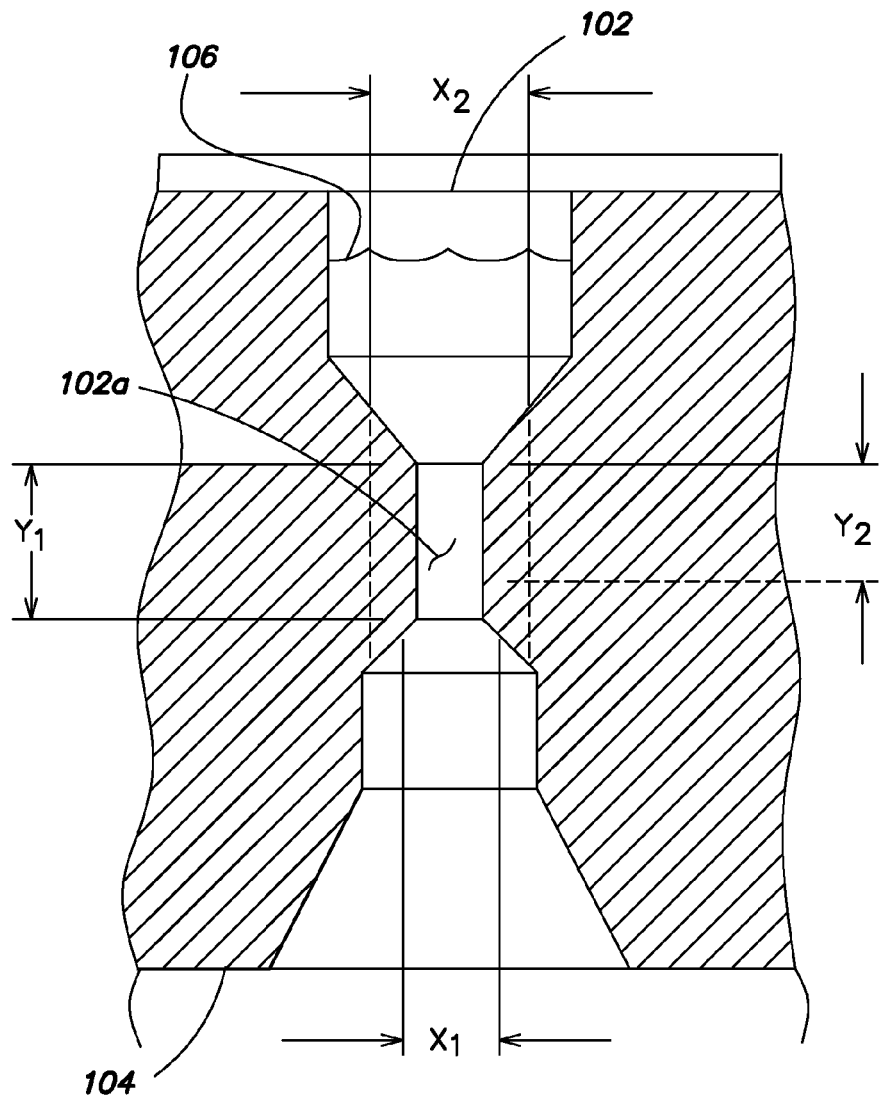
FIG. 1B is an exploded view of an exemplary embodiment of the orifice of FIG. 1A.

FIG. 1B is an exploded view of an exemplary embodiment of the orifice 102 of FIG. 1A. Other orifice shapes and/or sizes may be used. The orifice 102 includes a narrow portion 102a having a width $X_1$ and a length $Y_1$.

During cleaning, the cleaning solution may etch the orifice 102 such that the orifice becomes wider and/or shorter. For example, the width $X_1$ of the portion 102a may increase to a width $X_2$ as a result of the etchant corroding the portion 102a. Furthermore, the length $Y_1$ of the portion 102a may decrease to a length $Y_2$.

The flow characteristics of the orifice 102 may be affected due to the changed width and/or height of the orifice 102, thereby affecting the deposition capabilities of the component 100. Furthermore, although not shown, the component 100 may include a number of orifices. In some instances, the cleaning solution may unevenly erode the orifices such that after cleaning, the orifices have different widths and/or lengths. In instances where the component 100 has orifices with different dimensions, the component will not uniformly distribute a gas over a substrate. Thus, deposition layers may be uneven and potentially out of tolerance.

Figure 2:
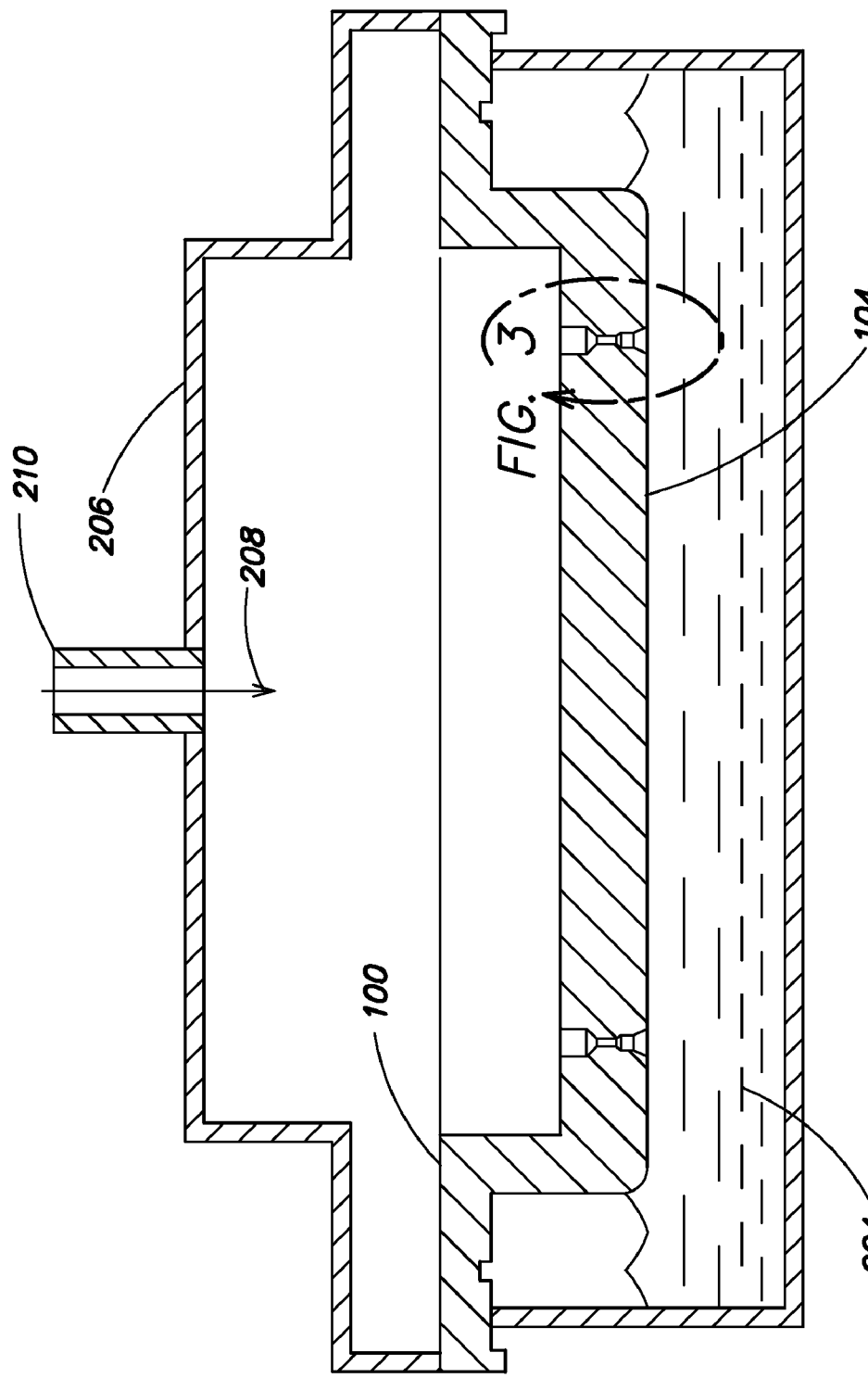
FIG. 2 is a side view of a component placed within a bath, in accordance with the invention.

In accordance with the present invention, a method of uniformly cleaning a component is provided where contact between a portion of an orifice and a cleaning solution may be minimized during cleaning of the component. FIG. 2 is a side view of the component 100 placed within a bath 204, in accordance with the invention. The bath 204 comprises a cleaning solution which removes residue from the component 100. As will be discussed in greater detail with reference to FIG. 4, the cleaning solution in the bath 204 may be formed in accordance with the cleaning requirements of the component 100.

With reference to FIG. 2, the component 100 is attached to a jig 206 which has a passage 210 configured to allow the flow of a fluid 208 into the jig 206. In one embodiment, the jig 206 may be hollow and configured such that the component 100 has a fluid tight fit with the jig 206 when the component 100 is placed on the jig 206 (e.g., via one or more o-rings or other seals (not shown)). Furthermore, the jig 206 is configured such that the jig 206 may hold a pressure at an upper surface of the component 100. The jig 206 may be constructed, for example, from a material which is non-reactive with an acid or other etchant, such as polyethylene or the like.

Figure 3:
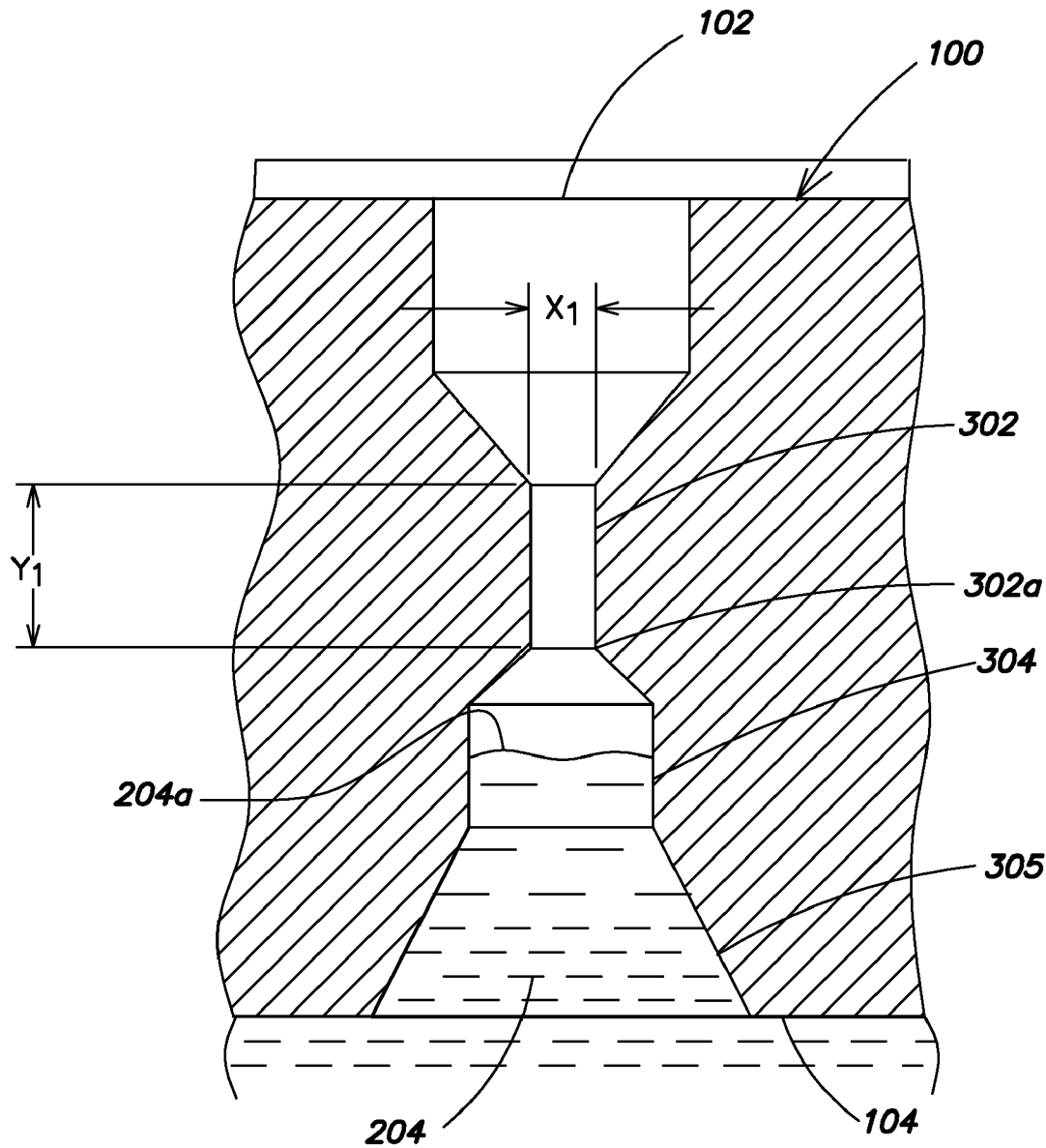
FIG. 3 is a side elevational view of an exemplary embodiment of an orifice of the component of FIG. 2.

FIG. 3 is a side elevational view of an exemplary embodiment of the orifice 102 of the component 100. The orifice 102 includes a first, narrow portion 302, a second portion 304, and a third portion 305. The first, narrow portion 302 has a width $X_1$ and a length $Y_1$ that, to a large extent, dictate the flow characteristics of a gas through the component 100. In one embodiment of the present invention, the width $X_1$ is in a range of about 12 microns to about 20 microns and preferably is about 16 microns. However, the width $X_1$ of the first, narrow portion 302 may vary according to the application of the component 100. For example, applications requiring high flow rates of gases from the component 100 may have wider orifices. Alternatively, applications requiring lower flow rates may have narrower orifices.

In one embodiment, the length $Y_1$ is in a range of about 40 mils to about 45 mils and is preferably about 43 mils. It should be noted that the length of the first, narrow portion 302 may vary according to the application of the component 100. To further illustrate, applications requiring a higher flow rate may have a shorter length. On the other hand, applications requiring a lower flow rate may have a longer length. For example, both the length of the first, narrow portion 302 and the width of the first, narrow portion 302 may be determined according to the following ratio: flow rate=$(12.1*(X_1)^3)/Y_1$.

As will be described further below, in at least one embodiment, the first narrow portion 302 of the component 100 is protected as the front face 104 of the component 100 is cleaned with the cleaning solution in the bath 204. As such, the first, narrow portion 302 is not damaged during cleaning of the component 100. For example, the component 100 may be coupled to the jig 206. Then, to clean the front face 104 of the component 100 while protecting the first, narrow portion 302 of the orifice 102, the front face 104 may be placed in the cleaning solution of the bath 204 while a fluid (e.g., gas) is fed into the first, narrow portion 302 of the component 100 via the passage 210 of the jig 206. After the front face 104 is cleaned, fluid flow to the first narrow portion 302 of the orifice 102 may be halted so as to allow cleaning solution to enter and clean the first, narrow portion 302. For example, a vacuum may be applied to the first, narrow portion 302 via the passage 210 of the jig 206 so as to draw cleaning solution into the first, narrow portion 302 of the orifice 102 (as described further below).

Figure 4:
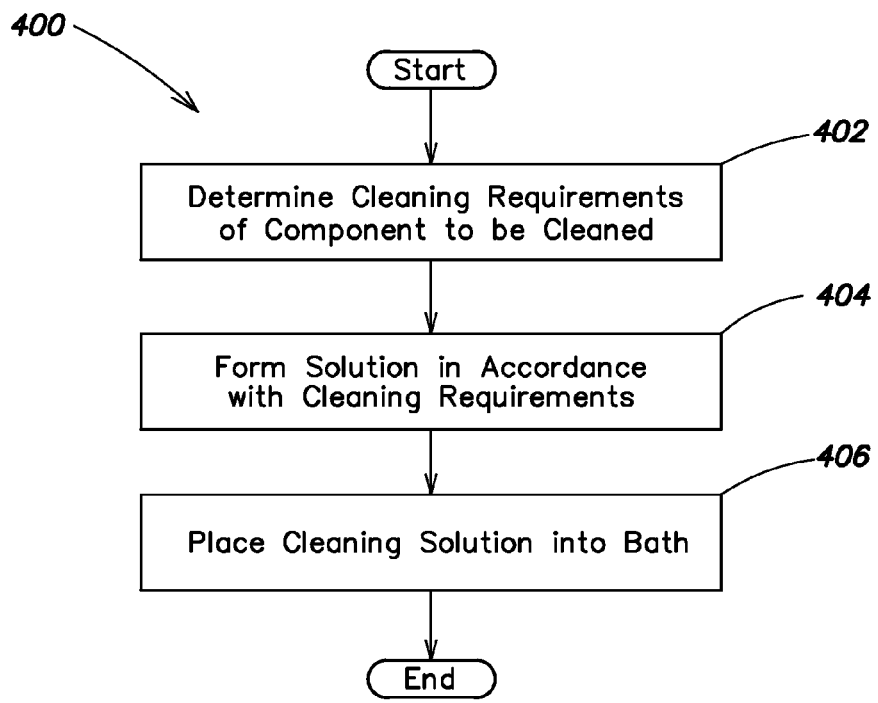
FIG. 4 illustrates a process of forming a cleaning solution in accordance with the present invention.

FIG. 4 illustrates a process 400 of forming a cleaning solution in accordance with the present invention. With reference to FIG. 4, in a step 402, the cleaning requirements of a component, such as the component 100 are determined. For example, the amount of residue to be removed from the component 100 may be determined. Based on the cleaning requirements of the component 100, a cleaning solution may be formed (in the step 404).

As an example, one part of the cleaning solution may be an etchant (e.g. hydrofluoric acid (HF) or anything capable of removing residue) and a second part of the cleaning solution may be a passivator (e.g., nitric acid ($HNO_3$) or anything which prevents corrosion). In accordance with one embodiment of the present invention, a cleaning solution may be formed with about 10% HF and about 90% $HNO_3$. However, the amount of etchant used and the amount of passivator used in the cleaning solution may vary depending on the etching requirements for the component being cleaned. To further illustrate, if greater etching is required, the cleaning solution may include about 15% HF and about 85% $HNO_3$. If less etching is required, then a cleaning solution having about 5% HF and about 95% $HNO_3$ may be used. Other ratios of etchant to passivator and/or other cleaning solution chemistries may be used. After formation, the cleaning solution is placed in a bath in a step 406, such as the bath 204, for cleaning of a component, such as the component 100.

Figure 5:
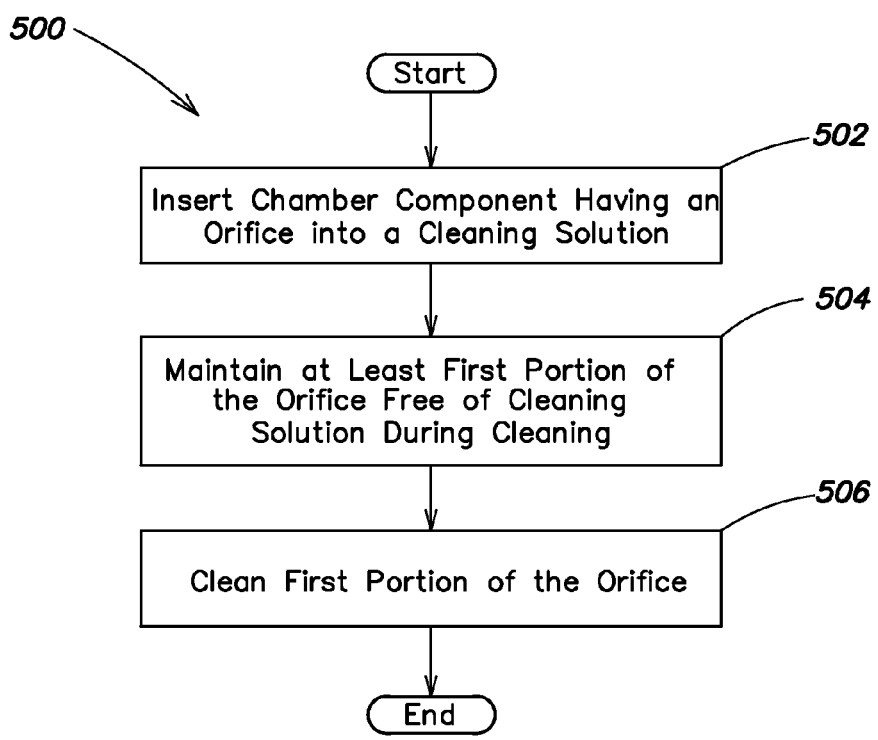
FIG. 5 is a flowchart illustrating a process for cleaning a component in accordance with an embodiment of the present invention.

FIG. 5 is a flowchart illustrating a process 500 for cleaning a component in accordance with an embodiment of the present invention. In a step 502, a chamber component having an orifice is inserted into a cleaning solution. For example, making reference to FIG. 2, the component 100, having the orifice 102, is inserted into the bath 204 having a cleaning solution. Once the component 100 is placed in the cleaning solution, the component 100 is cleaned in a step 504.

In the step 504, at least a first portion of the orifice is maintained free of a cleaning solution while the component is cleaned. For example, as shown in FIG. 3, the first, narrow portion 302 of the orifice 102 may be maintained free of cleaning solution (as shown by the upper boundary 204a of the cleaning solution). In accordance with an embodiment of the present invention, a portion (or all) of an orifice of a component is maintained free of the cleaning solution by injecting a gas (e.g., air, oxygen, nitrogen, argon, xenon, or any other suitable gas) into the orifice during cleaning of the component. For example, making reference again to FIG. 2, when the component 100 is placed in the bath 204, a gas may be injected into the jig 206 through the passage 210. The gas may be injected into the component 100 at a pressure which prevents cleaning solution from entering into the first, narrow portion 302 (FIG. 3) of the orifice 102. In some embodiments, the gas may be injected at a pressure of about 1.1 atmospheres to about 1.5 atmospheres, although other pressures may be used.

With reference to FIG. 3, when the gas is injected into the jig 206 via the passage 210, the gas flows into the first, narrow portion 302 of the orifice 102. As the gas flows into the first, narrow portion 302, the cleaning solution 204 is maintained below an end 302a of the first, narrow portion 302 of the orifice 102. The cleaning solution may be maintained at any other desired level, and may be excluded entirely from the orifice 102 by adjusting the pressure within the jig 206.

As previously mentioned, the dimensions $X_1$ and $Y_1$ of the first, narrow portion 302 of the orifice may be important to the functionality of the component 100. The end 302a is the end point of the first, narrow portion 302. Thus, if the cleaning solution rises above the end 302a during cleaning of the face 104 of the component 100, the cleaning solution may erode the first, narrow portion 302, thereby altering the dimensions $X_1$ and $Y_1$.

In the embodiment shown in FIG. 3, the face 104 of the component 100 is cleaned along with second and third portions 304 and 305 of the orifice 102 with the cleaning solution of the bath 204. In some embodiments, the time for cleaning the face 104 and/or the second and third portions 304 and 305 can be in a range from about ten minutes to about five hours. Other cleaning times may be used. It should be noted that if the first, narrow portion 302 is exposed to the cleaning solution for the same period of time (e.g., ten minutes to five hours), the first, narrow portion 302 may erode (e.g., unacceptably). In general, the duration of cleaning depends on the type and amount of residue which has accumulated on the component 100. For example, if the component 100 has been used in processes which have resulted in the build-up of carbon on the component 100, cleaning may last up to five hours.

In a step 506, the first portion of the orifice of the component is cleaned. For example, gas flow to the orifice may be stopped to allow cleaning solution to enter the orifice. In at least one embodiment, a vacuum may be applied to the orifice. For example, in the embodiment of FIG. 2, a vacuum may be applied to the jig 206 that draws cleaning solution through the orifice 102 and out of the passage 210 of the jig 206. In some embodiments, a vacuum in the range between about 250 mTorr and about 750 mTorr and more preferably about 500 mTorr may be applied to the jig 206 and/or the orifice 102. When the vacuum is applied to the first, narrow portion 302 of the orifice 102, the cleaning solution moves into the first, narrow portion 302 and cleans residue disposed therein.

The first, narrow portion 302 of the orifice 102 may be, for example, continuously cleaned (e.g., the cleaning solution may be in continuous contact with the first portion of the orifice). In an alternative embodiment, the cleaning solution may be cycled into and out of the first portion of the orifice. In this embodiment, gas is repeatedly pumped into and out of the first portion (e.g., at regular intervals) such that the cleaning solution is drawn into and then out of the first, narrow portion 302 of the orifice 102. When the gas is pumped into the first, narrow portion 302, the gas forces the cleaning solution out of the first, narrow portion 302. When the gas is pumped out of the first, narrow portion 302, vacuum is again created and the cleaning solution moves back into the first, narrow portion 302 for cleaning of residue. In at least one embodiment, cleaning of the first portion of the orifice may be performed for about 5 minutes, although longer or shorter cleaning times may be used.

Figure 6:
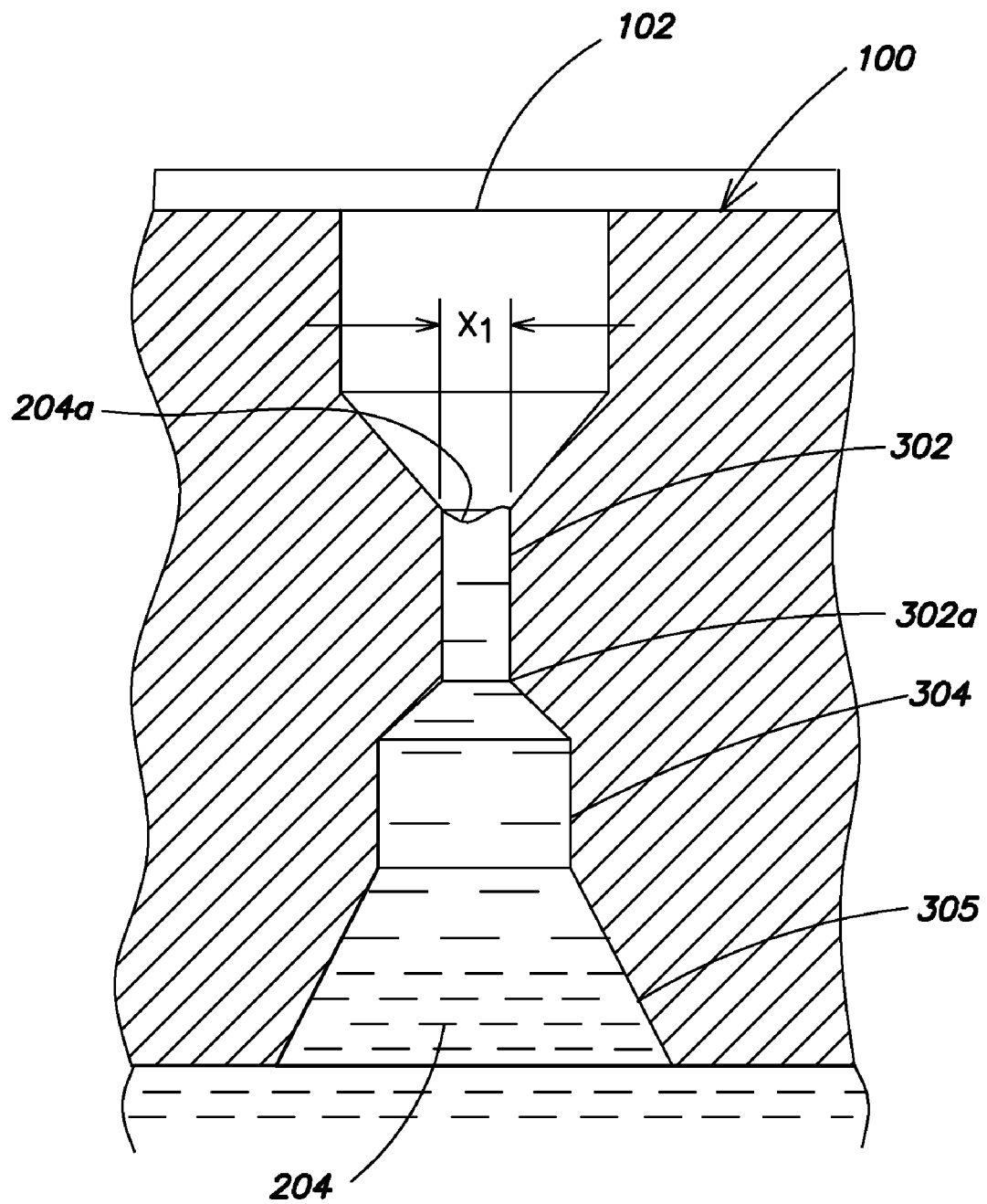
FIG. 6 shows a cleaning solution within a first, narrow portion of an orifice at a point that indicates a top level of a cleaning solution within a bath.

To further illustrate, FIG. 6 shows the cleaning solution within the first, narrow portion 302 of the orifice 102 at a point 204a that indicates a top level of the cleaning solution within the bath 204. Initially, gas is pumped out of the first, narrow portion 302 of the orifice 102 to form a vacuum. When the gas is pumped out to form a vacuum, the cleaning solution moves into the first, narrow portion 302. The cleaning solution may flow through the first, narrow portion 302 of the orifice 102, or may be held within the first, narrow portion 302 for a suitable time period.

Alternatively, gas may be pumped back into the first, narrow portion 302 of the orifice 102, thereby forcing the cleaning solution out. After the cleaning solution is forced out of the first, narrow portion 302, gas again may be pumped out of the orifice 102 so that cleaning solution from the bath 204 moves into the first, narrow portion 302 for further cleaning. This process may be repeated until the first portion is sufficiently clean. After the orifice is cleaned, the process 500 is complete.

Figure 7:
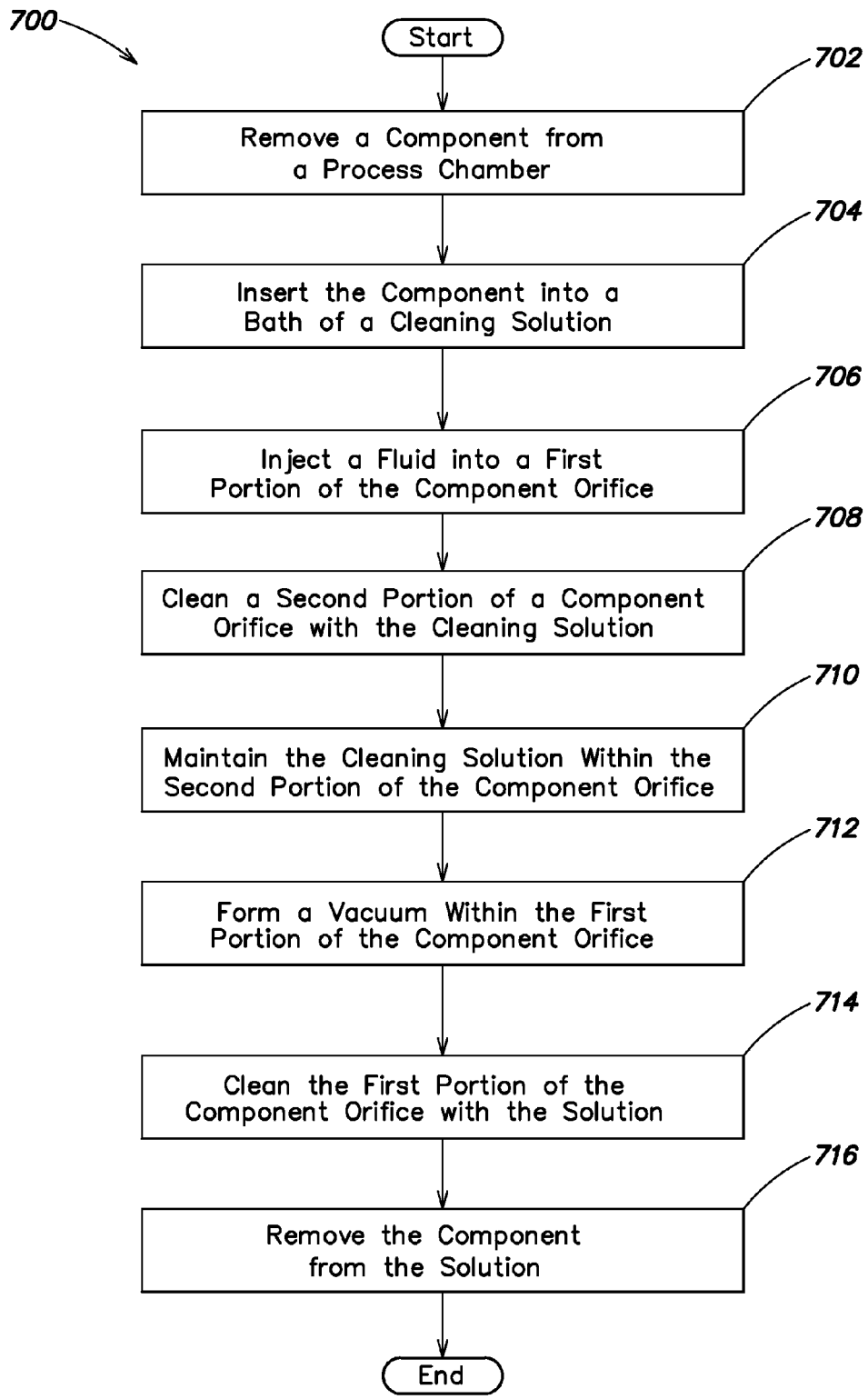
FIG. 7 illustrates a process for cleaning a component of a processing chamber in accordance with an embodiment of the present invention.

FIG. 7 illustrates a process 700 for cleaning a component of a processing chamber in accordance with an embodiment of the present invention. Initially, a component is removed from a process chamber in a step 702. Once the component is removed from the process chamber, the component is inserted into a bath having a cleaning solution in a step 704. When the component is inserted into the bath, the process 700 performs a step 706.

In the step 706, a fluid (e.g., nitrogen or another gas such as an inert gas) is injected into a first portion of an orifice of the component. The fluid is injected to prevent the cleaning solution from entering the first portion of the orifice while a second portion of the orifice is cleaned. As such, the cleaning solution does not corrode the first portion of the orifice while the second portion of the orifice is cleaned in a step 708. Therefore, the dimensions of the first portion are maintained during the cleaning process.

During cleaning of the second portion of the orifice, the cleaning solution is maintained within the second portion of the orifice (step 710). For example, making reference again to FIG. 3, the fluid maintains the cleaning solution of the bath 204 below the point 302a of the first, narrow portion 302 of the orifice 102 during cleaning of the second portion 304. Therefore, the first, narrow portion 302 remains free of the cleaning solution while the second portion 304 is cleaned. Once the second portion is cleaned, the process 700 performs step 712.

During the step 712, a vacuum is formed in the first portion of the orifice. The vacuum is formed in the first portion of the orifice by pumping out the fluid in the orifice (which was supplied during step 708). In accordance with an embodiment of the present invention, a vacuum in a range between about 250 mTorr and about 750 mTorr and more preferably about 500 mTorr may be used. When the vacuum forms in the first portion of the orifice, cleaning solution enters the orifice and cleans the first portion (step 714).

For example, making reference to FIG. 6, when a vacuum is formed in the first, narrow portion 302 of the orifice 102, the cleaning solution in the bath 204 enters therein. As the cleaning solution enters the first, narrow portion 302, the cleaning solution removes residue accumulated in the first, narrow portion 302. In one embodiment, the cleaning solution remains in the first, narrow portion 302 of the orifice 102 for a period of about five minutes (although other cleaning times may be used). After the first portion of the orifice is cleaned, the component is removed from the solution in a step 716 and the process 700 is completed.

The foregoing description discloses only exemplary embodiments of the invention. Modifications of the above disclosed apparatus and methods which fall within the scope of the invention will be readily apparent to those of ordinary skill in the art. For instance, the time in which a portion of an orifice is exposed to cleaning solution may vary depending upon the residue present therein. In addition, cleaning solutions having a variety of etchants and/or passivators may be used. As a result, the time of exposing an orifice may also depend on the cleaning solution that is used.

Accordingly, while the present invention has been disclosed in connection with exemplary embodiments thereof, it should be understood that other embodiments may fall within the spirit and scope of the invention, as defined by the following claims.

The invention claimed is:

1. A method of cleaning a semiconductor fabrication chamber component having an orifice comprising:
    placing the component into a bath having a cleaning solution;
    injecting a fluid into the orifice thereby maintaining at least a first portion of the orifice free from cleaning solution while the cleaning solution cleans the component;
    controlling the amount of time the orifice is in contact with the cleaning solution; and
    withdrawing the fluid from the orifice such that cleaning solution enters into the first portion of the orifice and cleans the first portion of the orifice;
    wherein withdrawing the fluid from the orifice comprises applying a vacuum to the orifice.

2. The method of claim 1, wherein the component is a gas distribution element.

3. The method of claim 2, wherein the component is a face plate used in a deposition chamber.

4. The method of claim 1, wherein the cleaning solution comprises:
    hydrofluoric acid (HF); and
    nitric acid ($HNO_3$).

5. The method of claim 4, wherein the cleaning solution comprises about 10% hydrofluoric acid and about 90% nitric acid.

6. The method of claim 4, wherein the cleaning solution comprises about 15% hydrofluoric acid and about 85% nitric acid.

7. The method of claim 4, wherein the cleaning solution comprises about 5% hydrofluoric acid and about 95% nitric acid.

8. The method of claim 1, wherein the fluid is nitrogen gas.

9. The method of claim 1, wherein the fluid is an inert gas.

10. The method of claim 1, further comprising:
    flowing the fluid into the orifice after the fluid is withdrawn from the orifice; and
    withdrawing the fluid from the orifice a second time.

11. The method of claim 1, wherein flowing the fluid into the orifice comprises:
    coupling a jig to the component; and
    flowing the fluid through the jig and into the orifice.

12. The method of claim 11, wherein the jig forms a fluid tight seal with the component.

13. A method of cleaning a semiconductor fabrication chamber component having an orifice comprising:
    placing the component into a bath having a cleaning solution;
    injecting a fluid into the orifice thereby maintaining at least a first portion of the orifice free from cleaning solution while the cleaning solution cleans a second portion of the orifice;

controlling the amount of time the orifice is in contact with the cleaning solution; and withdrawing the fluid from the orifice such that cleaning solution enters into the first portion of the orifice and cleans the first portion of the orifice;

wherein withdrawing the fluid from the orifice comprises applying a vacuum to the orifice.

14. The method of claim 13, wherein the component is a gas distribution element.

15. The method of claim 14, wherein the component is a face plate used in a deposition chamber.

16. The method of claim 13, wherein the cleaning solution comprises:

hydrofluoric acid (HF); and nitric acid ($HNO_3$).

17. The method of claim 13, wherein flowing the fluid into the orifice comprises:

coupling a jig to the component; and flowing the fluid through the jig and into the orifice.

* * * * *